(12) United States Patent
Griffin et al.

(10) Patent No.: US 9,423,297 B2
(45) Date of Patent: Aug. 23, 2016

(54) OPTICAL DEVICE WITH OPTICAL ELEMENT AND SENSOR FOR SAMPLING LIGHT

(71) Applicant: 3M INNOVATIVE PROPERTIES COMPANY, St. Paul, MN (US)

(72) Inventors: Michael E. Griffin, Maplewood, MN (US); David A. Ender, New Richmond, WI (US)

(73) Assignee: 3M INNOVATIVE PROPERTIES COMPANY, Saint Paul, MN (US)

( * ) Notice: Subject to any disclaimer, the term of this patent is extended or adjusted under 35 U.S.C. 154(b) by 78 days.

(21) Appl. No.: 14/367,423

(22) PCT Filed: Dec. 17, 2012

(86) PCT No.: PCT/US2012/070032
§ 371 (c)(1),
(2) Date: Jun. 20, 2014

(87) PCT Pub. No.: WO2013/096169
PCT Pub. Date: Jun. 27, 2013

(65) Prior Publication Data
US 2015/0330834 A1    Nov. 19, 2015

Related U.S. Application Data

(60) Provisional application No. 61/579,144, filed on Dec. 22, 2011.

(51) Int. Cl.
*G02B 6/13* (2006.01)
*G01J 1/42* (2006.01)
(Continued)

(52) U.S. Cl.
CPC .............. *G01J 1/4257* (2013.01); *G01J 1/04* (2013.01); *G02B 6/0013* (2013.01); *H01L 25/167* (2013.01); *H01L 2924/0002* (2013.01)

(58) Field of Classification Search
CPC ......... H01L 21/00; H01L 33/00; H01L 33/60; H01L 33/48; G02B 6/00
USPC ...................................................... 250/205
See application file for complete search history.

(56) References Cited

U.S. PATENT DOCUMENTS 5,751,388 A   5/1998  Larson
5,793,456 A   8/1998  Broer
(Continued)

FOREIGN PATENT DOCUMENTS

DE   102007012381   9/2008
EP       0992824    4/2000
(Continued)

OTHER PUBLICATIONS

International Search Report for PCT International Application No. PCT/US2012/070032, mailed on Feb. 28, 2013, 5 pages.

*Primary Examiner* — Seung C Sohn
(74) *Attorney, Agent, or Firm* — Yufeng Dong

(57) ABSTRACT

Optical devices (100) that contain a sensor (140) are described. More particularly, optical devices that contain a light source (120), cavity (110) and sensor (140), in which the optical device (100) may provide an optimal light output from an output surface (112) of the cavity (110) based on various characteristics of the light are described. Additionally, methods of making and using such optical devices as well as arrays of such optical devices are disclosed.

17 Claims, 3 Drawing Sheets

(51) Int. Cl.
  *G01J 1/04* (2006.01)
  *F21V 8/00* (2006.01)
  *H01L 25/16* (2006.01)

(56) References Cited

U.S. PATENT DOCUMENTS

| | | | |
|---|---|---|---|
| 5,825,543 | A | 10/1998 | Ouderkirk |
| 5,867,316 | A | 2/1999 | Carlson |
| 5,882,774 | A | 3/1999 | Jonza |
| 6,122,103 | A | 9/2000 | Perkins |
| 7,436,469 | B2 | 10/2008 | Gehlsen |
| 7,446,827 | B2 | 11/2008 | Ko |
| 7,525,126 | B2 | 4/2009 | Leatherdale |
| 7,710,511 | B2 | 5/2010 | Gehlsen |
| 8,315,287 | B1 * | 11/2012 | Roggero ............ G02B 6/12004 372/50.1 |
| 8,582,618 | B2 * | 11/2013 | Roggero ................. H01S 5/18 372/43.01 |
| 2002/0159019 | A1 | 10/2002 | Pokorny |
| 2005/0285131 | A1 | 12/2005 | Gallup |
| 2006/0252167 | A1 | 11/2006 | Wang |
| 2006/0257678 | A1 | 11/2006 | Benson, Jr. |
| 2007/0153162 | A1 | 7/2007 | Wright |
| 2007/0153384 | A1 | 7/2007 | Ouderkirk |
| 2007/0257270 | A1 | 11/2007 | Lu |
| 2008/0290353 | A1 | 11/2008 | Medendorp, Jr. |

FOREIGN PATENT DOCUMENTS

| | | |
|---|---|---|
| WO | WO 2008-144644 | 11/2008 |
| WO | WO 2008-147753 | 12/2008 |

* cited by examiner

OPTICAL DEVICE WITH OPTICAL ELEMENT AND SENSOR FOR SAMPLING LIGHT

CROSS REFERENCE TO RELATED APPLICATIONS

This application is a national stage filing under 35 U.S.C. 371 of PCT/US2012/070032, filed Dec. 17, 2012, which claims priority to US Provisional Application No. 61/579,144 filed Dec. 22, 2011, the disclosure of which is incorporated by reference in its/their entirety herein.

FIELD

The present description relates to optical devices that contain a sensor. More particularly, the present description relates to optical devices that contain a light source, cavity and sensor, in which the optical device may provide an optimal light output from an output surface of the cavity based on various characteristics of the light. The present description further relates to methods of making and using such an optical device.

BACKGROUND

Light emitting diodes (LEDs) are becoming an increasingly popular source of light in a number of lighting applications. In many of these applications, LEDs may serve as an improvement over the previously used incandescent or fluorescent lamps because of the low voltage and high efficiency at which LEDs operate. Unfortunately, when one or more LEDS are coupled to a lighting cavity (such as a backlighting cavity) in order to mix and redirect light, optical losses may occur due to multiple reflections within the cavity which do not escape. Further, it is often a challenge to sample optical output of an optical cavity without degrading optical output. It would therefore be highly desirable to provide a solution to optical losses in the cavity while also sampling the light for appropriate characteristics without degrading optical output.

SUMMARY

In one aspect, the present disclosure describes an optical device. In some embodiments, the optical device includes a cavity, having an output surface; one or more light sources disposed to inject light into the cavity; an optical element at least partially disposed within the cavity; and a sensor optically coupled to the optical element. The optical element is configured to direct a first portion of light from the one or more light sources to the output surface and a second portion of light form the one or more light sources to the sensor. In some embodiments, the second portion of light may possess a power of no more than 10% of the first portion. The cavity disclosed may include a back reflector disposed substantially parallel to the output surface and/or at least two side reflectors disposed substantially orthogonal to the output surface. In some embodiments, the cavity may be hollow. The one or more light sources may include at least one LED or at least one CCFL. The one or more light sources may include a first, second and third light source that inject light of a first wavelength, second wavelength and third wavelength respectively. The first, second and third wavelength may be red, green and blue wavelengths, respectively, or the three wavelengths may include at least blue and yellow wavelength light. In at least one embodiment, the sensor will include a photodetector. In other embodiments, the sensor may include a silicon optical bench. Preferably, the amount of light that reaches the sensor is within the detection range of the sensor. The optical element may be made up of at least one slit or channel. In one embodiment, the second portion of light may be directed in a separate direction from the first portion of light because the second portion of light experiences Fresnel reflection.

In another aspect, the present disclosure describes a method for forming an optical device. The method includes the steps of forming a cavity including an output surface; positioning one of more light sources to inject light into the cavity; positioning an optical element at least partially within the cavity; and providing a sensor that is optically coupled to the optical element. The optical element is configured to direct a first portion of light from the one or more light sources to the output surface and a second portion of light from the one or more light sources to the sensor.

In yet another aspect, the present disclosure describes a method for producing light with a desired optical characteristic, in which the method includes a first step of providing an optical device. The optical device includes a includes a cavity having an output surface; one or more light sources disposed to inject light into the cavity; an optical element at least partially disposed within the cavity; and a sensor optically coupled to the optical element. The optical element is configured to direct a first portion of light from the one or more light sources to the output surface and a second portion of light form the one or more light sources to the sensor. The method includes the further steps of selecting a desired first optical characteristic of the first portion of light; detecting a second optical characteristic of the second portion of light using the sensor; and adjusting the injected light from the one or more light sources to provide the first portion of light with the desired first optical characteristic. The first and second optical characteristics may, in some embodiments, be intensity, wavelength and/or phase.

In another aspect, the present disclosure describes an array of optical devices. In some embodiments, each optical device includes a cavity having an output surface; one or more light sources disposed to inject light into the cavity; an optical element at least partially disposed substantially within the cavity; and a sensor optically coupled to the optical element. The optical element is configured to direct a first portion of light from the one or more light sources to the output surface and a second portion of light form the one or more light sources to the sensor.

DETAILED DESCRIPTION

The present disclosure provides an optical device that facilitates optimization of various light output characteristics, including intensity, wavelength and phase. The optical device may generally be made up of cavity having an output surface, one or more light sources disposed to inject light into the cavity, an optical element at least partially disposed within the cavity, and a sensor optically coupled to the optical element.

In some embodiments, the sensor is configured to detect wavelengths of light; in others, the sensor is configured to detect the intensity of light. In an exemplary embodiment, the sensor is connected to a controller that adjusts the injected light. By testing and adjusting the light over one or more iterations, the optical device optimizes its output so that the output light has one or more desired optical characteristics.

In certain embodiments of the present disclosure, the portion of light directed toward the output surface is much greater than the portion of light directed to the sensor, thereby limiting the light used by the sensor. Because light utilized by the sensor is unusable vis-a-vis a viewer observing the output surface, these embodiments of the present disclosure can provide high efficiency light output that is suitable for various applications.

Figure 1:
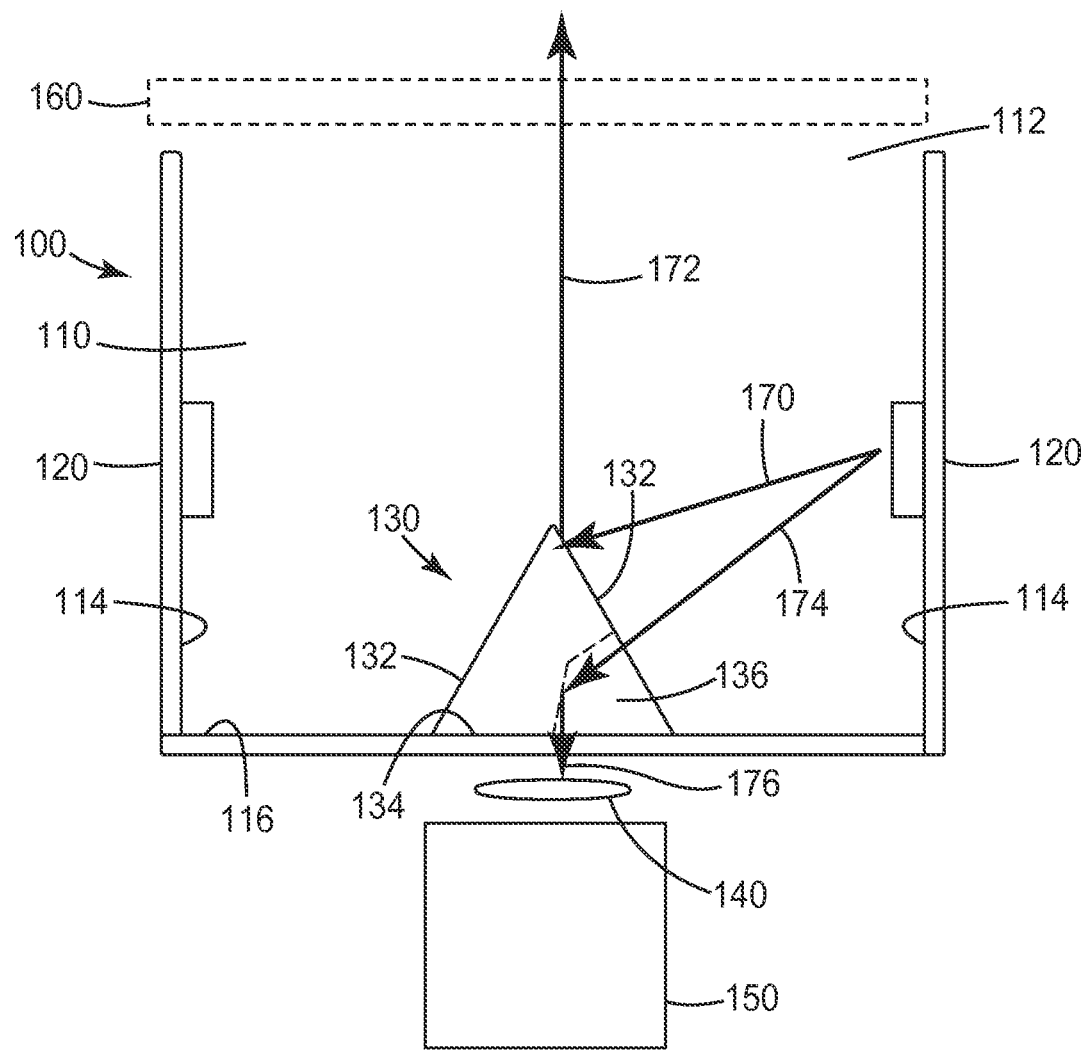
FIG. 1 is a cross-sectional view of an optical device according to the present description.

FIG. 1 is a schematic cross-sectional view of one embodiment of an optical device 100. Optical device 100 includes a cavity 110 having an output surface 112. The optical device further includes one or more light sources 120 that are disposed to inject light into the cavity 110. In addition, the optical device includes an optical element 130 that is at least partially disposed within the cavity and a sensor 140 that is optically coupled to the optical element. In some embodiments, as illustrated in FIG. 1, the optical element 130 is configured to direct a first portion of light from one or more light sources 120 to the output surface 112 and a second portion of light from one or more light sources to the sensor 140. This is discussed at length with respect to rays 170 and 174.

In some embodiments, the cavity 110 may include one or more side reflectors 114 and a back reflector 116, or multiple back reflectors, where the side reflectors and back reflector form the cavity. Although the cavity 110 is depicted in FIG. 1 as having four side reflectors 114, the cavity can include any suitable number of side reflectors 114 and take any suitable cross-sectional shape, e.g., square, rectangular, circular, etc. Further, the side reflectors 114 and back reflector 116 can have any suitable shape, e.g., flat, curved, etc. The cavity 110 may be hollow or it may be filled or partially filled with a substance. In some embodiments, the cavity 110 may be filled with an optical bonding material to stabilize and protect the components located within. Any suitable material can be used to fill or partially fill the cavity 110, e.g., optically clear epoxy, silicone casting materials, polyurethanes and the like.

In some embodiments, one or more of the back reflector(s) 116 and the side reflectors 114 are preferably highly reflective. For example, the back reflector 116 and side reflectors 114 can have an on-axis average reflectivity for visible light emitted by the light sources of at least 90%, 95%, 98%, 99%, or more for visible light of any polarization. Such reflectivity values also can reduce the amount of loss in a highly recycling cavity. Such reflectivity values encompass all visible light reflected into a hemisphere, i.e., such values include both specular and diffuse reflections.

The back reflector 116 and side reflectors 114 can be predominately specular, diffuse, or combination specular/diffuse reflectors, whether spatially uniform or patterned. In some embodiments, the back reflector 116 and side reflectors 114 can be semi-specular reflectors, as described in PCT Patent Publication No. 2008/144644, entitled RECYCLING BACKLIGHTS WITH SEMI-SPECULAR COMPONENTS. In some cases, the back reflector 116 and side reflectors 114 can be made from a stiff metal substrate with a high reflectivity coating, or a high reflectivity film laminated to a supporting substrate. Suitable high reflectivity materials include Vikuiti™ Enhanced Specular Reflector (ESR) multi-layer polymeric film available from 3M Company; a film made by laminating a barium sulfate-loaded polyethylene terephthalate film (2 mils thick) to Vikuiti™ ESR film using a 0.4 mil thick isooctylacrylate acrylic acid pressure sensitive adhesive, the resulting laminate film referred to herein as "EDR II" film; E-60 series Lumirror™ polyester film available from Toray Industries, Inc. (Tokyo, Japan); porous polytetrafluoroethylene (PTFE) films, such as those available from W. L. Gore & Associates, Inc. (Newark, N.J.); Spectralon™ reflectance material available from Labsphere, Inc. (North Sutton, N.H.); Miro™ anodized aluminum films (including Miro™ 2 film) available from Alanod Aluminum-Veredlung GmbH & Co. (Ennepetal, Germany); MCPET high reflectivity foamed sheeting from Furukawa Electric Co., Ltd. (Tokyo, Japan), White Refstar™ films and MT films available from Mitsui Chemicals, Inc. (Tokyo, Japan).

The back reflector 116 and side reflectors 114 can be substantially flat and smooth, or they may have a structured surface associated with them to enhance light scattering or mixing. Such a structured surface can be imparted (a) on the surfaces of the reflectors, or (b) on a transparent coating applied to the surfaces. In the former case, a highly reflecting film may be laminated to a substrate in which a structured surface was previously formed, or a highly reflecting film may be laminated to a flat substrate (such as a thin metal sheet, as with Vikuiti™ Durable Enhanced Specular Reflector-Metal (DESR-M) reflector available from 3M Company (St. Paul, Minn.)) followed by forming the structured surface, such as with a stamping operation. In the latter case, a transparent film having a structured surface may be laminated to a flat reflective surface, or a transparent film may be applied to the reflector. Afterwards, a structured surface can be imparted to the top of the transparent film.

The back reflector 116 may be a continuous, unitary (and unbroken) layer on which the sensor 140 is mounted or it can be constructed discontinuously in separate pieces, or discontinuously insofar as it includes space for a sensor aperture 134 or the base of the optical element 130, in an otherwise continuous layer. Possible embodiments and configurations of the back reflector 116, the optical element 130, the sensor aperture 134, and the sensor 140 are discussed in further detail herein.

The cavity 110 may also include one or more side reflectors 114 located along at least a portion of the outer boundary of the cavity 110. The side reflectors 114 are preferably lined or otherwise provided with high reflectivity vertical walls to reduce light loss and improve recycling efficiency. The same reflective material or materials used for the back reflector 116 can be used to form these reflectors, or a different reflective material can be used. In some embodiments, the side reflectors 114 and back reflector 116 can be formed from a single sheet of material. Refractive structures may be used on or adjacent to the side reflectors 114 to achieve a desired reflection profile. The side reflectors 114 may be vertical, i.e., substantially orthogonal to the output surface 112, or, alternatively, one or more reflectors can be tilted or curved. Wall material, inclination, and shape can be chosen to adjust the brightness profile.

The optical device 100 includes one or more light sources 120 disposed to inject light into the cavity 110. In most cases, these light sources 120 are compact light emitting diodes (LEDs). For purposes of this disclosure, "LED" refers to a diode that emits light, whether visible, ultraviolet, or infrared. It includes incoherent encased or encapsulated semiconductor devices marketed as "LEDs," whether of the conventional or super radiant variety. If the LED emits non-visible light such as ultraviolet light, and in some cases where it emits visible light, it may be packaged to include a phosphor (or it may illuminate a remotely disposed phosphor) to convert short wavelength light to longer wavelength visible light. Such a construction may in some cases yield a device that emits white light. An "LED die" is an LED in its most basic form, i.e., in the form of an individual component or chip made by semiconductor processing procedures. The component or chip can include electrical contacts suitable for application of power to energize the device. The individual layers and other functional elements of the component or chip are typically formed on the wafer scale, and the finished wafer can then be diced into individual piece parts to yield a multiplicity of LED dies.

Multicolored light sources, whether or not used to create white light, can take many forms in a backlight, with different effects on color and brightness uniformity of the backlight output area. In one approach, multiple LED dies (e.g., a red, a green, and a blue light emitting die) are all mounted in close proximity to each other on a lead frame or other substrate, and then encased together in a single encapsulant material to form a single package, which may also include a single lens component. Such a source can be controlled to emit any one of the individual colors, or all colors simultaneously. In another approach, individually packaged LEDs, with only one LED die and one emitted color per package, can be clustered together for a given optical device, the cluster containing a combination of packaged LEDs emitting different colors such as blue/yellow or red/green/blue. In still another approach, such individually packaged multicolored LEDs can be positioned in one or more lines, arrays, or other patterns.

If desired, other visible light emitters such as linear cold cathode fluorescent lamps (CCFLs) or hot cathode fluorescent lamps (HCFLs) can be used instead of or in addition to discrete LED sources as the one or more light sources 120. In addition, hybrid systems may be used. The combinations of light emitters included in the one or more light sources 120 may vary widely, and include LEDs and CCFLs, and pluralities such as, for example, multiple CCFLs, multiple CCFLs of different colors, and LEDs and CCFLs.

Any suitable side-emitting LED can be used for any of the one or more light sources 120, e.g., Luxeon™ LEDs (available from Lumileds, San Jose, Calif.), or the LEDs described, e.g., in commonly owned and assigned U.S. patent application Ser. No. 11/381,324 (Leatherdale et al.), entitled LED PACKAGE WITH CONVERGING OPTICAL ELEMENT; and U.S. patent application Ser. No. 11/381,293 (Lu et al.), entitled LED PACKAGE WITH WEDGE-SHAPED OPTICAL ELEMENT. Other emission patterns may be desired for various embodiments described herein. See, e.g., U.S. Patent Publication No. 2007/0257270 (Lu et al.), entitled LED PACKAGE WITH WEDGE-SHAPED OPTICAL ELEMENT.

The one or more light sources 120 may be positioned in any suitable arrangement. Further, the light sources 120 may include light sources that emit different wavelengths or colors of light. For example, the light sources may include a first light source that emits a first wavelength of light, and a second light source that emits a second wavelength of light. The first wavelength may be the same as or different from the second wavelength. The one or more light sources 120 may also include a third light source that emits a third wavelength of light. See, e.g., PCT Patent Application No. 2008/147753, entitled WHITE LIGHT BACKLIGHTS AND THE LIGHT WITH EFFICIENT UTILIZATION OF COLORED LED SOURCES. In some embodiments, the various light sources 120 may produce light that, when mixed, provides white illumination light through the output surface 112. In other embodiments, the one or more light sources 120 may each product white light.

In some embodiments, light sources or light injection optics that at least partially collimate the emitted light may be preferred. Such light sources or light injection optics may include lenses, extractors, shaped encapsulants, other optical elements, or combinations thereof to provide a desired output into the cavity 110 of the disclosed optical device 100. Further, the one or more light sources 120 may include injection optics that partially collimate or confine light initially injected into the recycling cavity to propagation directions close to a transverse plane (in FIG. 1, the transverse plane being parallel to the plane of the paper), e.g., an injection beam having a full angle-width (about the transverse plane) at half maximum power (FWHM) in a range from 0 to 90 degrees, 0 to 60 degrees, 0 to 15 degrees, or 0 to 10 degrees or less. Suitable injection shapes include wedge, parabolic, compound parabolic, etc.

In general, the FWHM value of the light emitted into the cavity 110 by the one or more light sources 120 can be controlled to provide the desired collimation. Any suitable value of FWHM can be provided using any suitable technique. Further, the direction of the injected light can also be controlled to provide desired transport characteristics. For example, light from the one or more light sources 120 can be directed into the cavity at any suitable angle to the transverse plane.

The optical element 130 may be constructed from any suitable material. For example, the optical element 130 may be made from a metal such as machined aluminum or a polymeric substance such as a polycarbonate. In some cases, the optical element may be coated or covered with a reflective coating (such as a foil, a layer/film of a polymer with high refractive index). The coating may be placed on for example by vapor deposition. Sometimes the coating is a diffusive coating to avoid specular reflection. The optical element may be made from one material or it may be a composite made from more than one material. In some embodiments, the reflecting walls 132 are made from a different material than the rest of the optical element 130. The optical element 130 may also be substantially hollow. In some embodiments, the optical element 130 and the back reflector 116 may be formed together.

Optical element 130 may have the ability to perform multiple functions. Placement between two parallel side walls and in the path of rays normal to the sidewalls gives it the function of reducing multiple light ray bounces off of the sidewalls. It can also sample a portion of the rays striking it and redirect them to the detector 120, while reflecting the remainder into the cavity. The sampling characteristic of optical element 130 should be such that it can be easily designed to limit the sampled flux to be within the operating or detection range of the detector 120.

The optical element 130 may be positioned on the back reflector 116 in some embodiments. In this arrangement, at least part of the shared boundary between the optical element 130 and the back reflector 116 should include at least one sensor aperture 134. Alternatively, in some embodiments where the back reflector 116 is formed discontinuously, with space for the base or other cross-section of the optical element 130, the base of the optical element 130 may be substantially coplanar with the back reflector 116. Alternatively, the base could be positioned below the plane formed substantially by the back reflector 116. In these embodiments, a sensor aperture 134 is not required insofar as the base of the optical element 130 is not a substantially reflective surface.

In some embodiments, the optical element 130 may be positioned so that it is minimally obstructive to light that would otherwise exit the cavity 110 through the output surface 112 after only a few bounces. It may further be desirable to configure the optical element 130 to substantially only redirect light toward the sensor 140 that would otherwise reflect degeneratively within the cavity 110 or not be emitted efficiently, i.e., after only a few bounces, through the output surface 112. This may aid in minimizing optical degradation of the light through the output surface, which is an advantage of the presently disclosed optical system. These configurations may be suitable for certain applications where a higher efficiency embodiment of the present disclosure is desired.

The base of the optical element 130 is contemplated to be operable as any suitable shape. For example, the base of the optical element 130 could be circular, rectangular, elliptical, trapezoidal, polygonal, or any combination thereof.

The surfaces of the optical element 130, i.e., those faces other than the base, are also contemplated to be formed to any suitable shape. In an exemplary embodiment, the surfaces are straight planes, but the surfaces of the optical element may also be convex or concave, parabolic, polygonal, or of any other suitable geometry. Together, the base and the surfaces can form any suitable three-dimensional shape, truncated or non-truncated, including but not limited to truncated spheres, aspheres, cones, regular solids, and any suitable prismatoid. In some embodiments, it may be suitable to form the optical element 130 from a plurality or combination of the above-listed shapes to achieve desired optical behavior.

In an exemplary embodiment, the surfaces of the optical element 130 include reflecting walls 132. The reflecting walls 132 can be constructed from any suitable material, including any of those disclosed herein as suitable for the back reflector 116 and side reflectors 114. The reflecting walls 132 may completely cover the surfaces of the optical element 130 or may partially cover the surfaces of the optical element 130.

In exemplary embodiments, the optical element 130 may contain one or more apertures 136 to guide a portion of the light from the one or more light sources 120 toward the sensor 140. The apertures may be actual openings, i.e., hollow gaps, slits or channels in the material of the optical element 130 optionally lined with reflective material similar to that of the reflective walls 132, or they can be constructed of material with a suitable index of refraction such that light may be channeled from the surface of the optical element 130 to the sensor 140. In the latter case, the material may be chosen to provide a channel where the light is contained through total internal reflection (TIR), as in an optical fiber.

The apertures may be of any suitable shape or size. For example, the cross-section of the apertures, at the plane formed by or tangential to a surface of optical element 130, may resemble a straight or curved slit, a channel, a triangle, an "s" shape, a lozenge, or an ellipse or circle. Further, it is contemplated that the apertures may contain any combination or arrangement of any of these elements, including superimposition. The surface or surfaces of the optical element 130 may contain one or more of these apertures, in any suitable arrangement, distribution, and orientation.

The sensor 140 may be located either within or outside of the cavity 110. For example, the sensor 140 may be positioned behind the plane substantially formed by the back reflector 116. In this embodiment of the present disclosure, it may be necessary to include a sensor aperture 134 to allow light to exit the cavity and to become incident on the sensor 140. Alternatively, the sensor 140 can be positioned in front of the plane substantially formed by the back reflector 116. In this embodiment, a sensor aperture 134 may not be necessary, depending on the optical properties of the base of the optical element 130. While the sensor 140 is depicted in FIG. 1 as being positioned directly behind the optical element 130, in some applications it may be desirable to position the sensor 140 in a more remote location or at an angle where light passing through the sensor aperture 134 would not otherwise reach the sensor 140, in which case the sensor may be understood as a remote sensor. In these cases, suitable light channeling or redirecting elements may be used to direct the light (represented illustratively by random redirected ray 176) toward the sensor at a desirable angle.

An additional means of directing a portion of the light onto the sensor may be achieved through properly shaping the optical element and choosing a proper index of refraction differential between the optical element and the surrounding area. Properly choosing these specifications may allow one to properly split the incident rays towards the output surface (a first portion of light) and sensor (a second portion of light) through selective Fresnel reflection and refraction. More specifically, in one embodiment, the second, less substantial portion of light may be directed in a separate direction from the first portion of light because the second portion of light experiences Fresnel reflection. Proper use of Fresnel reflection may eliminate the need for additional coatings on the surface of optical element 130.

The sensor 140 may be constructed from any suitable materials or elements or it can be an aided or unaided human eye. For example, the sensor 140 may include one or more photodetectors on a printed circuit board (PCB), configured with suitable drive electronics. The sensor 140 can include one or more filters or optical elements configured to selectively accept or reject certain wavelengths, polarizations, or phases of light, which may also aid in embodiments where the sensor 140 is a human eye. Alternatively, in some embodiments, the sensor may include a silicon optical bench.

The sensor 140 can be configured with any suitable sensitivity and any suitable saturation level. It is desirable to configure the optical device 100 so the portion of light (i.e. the second portion) that is redirected by optical element 130 (represented illustratively by random redirected ray 176) and that ultimately reaches the sensor 140 is greater than or equal to the sensitivity of the sensor (i.e. within the detection range of the sensor), while less than the saturation level. For example, the sensitivity of the sensor 140 can be in a range between 0.1 mW and 0.001 mW, and the saturation level may be two to three orders of magnitude greater than the sensitivity. Because a high brightness LED may be capable of outputting 500 mW, a suitable configuration may only redirect a very small portion of the light injected into the cavity 110 by the one or more light sources 120. In these embodiments, the sensor may receive only a small portion of the total light from the light sources, allowing for efficient sampling of the light without significantly affecting the output light. Specifically, generally the second portion of light (that portion directed towards the sensor) will be no more than 10% of the first portion of light (that portion directed to the output surface). In some cases, the second of light may be no more than 5% of the first portion of light.

The optical device 100 may also include a controller 150. The controller 150 can be any device, component, or combination thereof that displays information from the sensor 140, interprets information from the sensor 140, adjusts the one or more light sources 120 based on information received or interpreted from the sensor 140, or does any combination of the preceding. In some embodiments, the controller 150 may be capable of receiving input, either from an external electronic component or from a user, whether indirectly or directly. For example, the controller 150 may be an electronic device that interprets information from the sensor 140, calculates if and to what degree to make adjustments to the one or more light sources 120, and then adjusts the one or more light sources 120.

In an exemplary embodiment, the controller 150 receives information from the sensor 140 regarding a particular optical characteristic. For example, the controller 150 may receive information about the intensity of light detected by the sensor 140. In some embodiments, the controller 150 may be preset or preprogrammed with a desired or target level for the particular optical characteristic. Upon receiving information from the sensor 140, the controller 150 may be configured to adjust certain parameters of the one or more light sources 120, e.g., power. In these embodiments, it may be desirable to have the controller 150 perform the above steps multiple times in order to iteratively approach the preset or preprogrammed level for the particular optical characteristic.

In other embodiments, it is contemplated that the controller 150 may receive input from a user, either indirectly or directly. For example, a user may decide a particular wavelength of light is desirable or suitable for a certain application of the present disclosure. The user could input this preference into the controller 150, and the controller then iteratively adjusts the one or more light sources 120 with information from the sensor 140. Thus, the optical device 100 can achieve a very precise and stable mixing of colors, resulting in the desired wavelength of light passing through the output surface 112.

In some embodiments of the present disclosure, the controller 150 may simply display information about the light incident on the sensor 140. For example, the controller 150 may display information about the wavelength or the intensity of light, which may be useful in applications where it is necessary for monitoring the light. In other applications, the display may indicate a need for maintenance, e.g., a drop in detected intensity may indicate the one or more light sources 120 may need to be replaced.

In other embodiments, the controller 150 may also include a device for manipulating the properties of the one or more light sources 120. For example, controller 150 may include a potentiometer to adjust the one or more light sources 120 until the controller 150 indicates a certain optical characteristic has been reached.

FIG. 1 illustrates further the operation of the exemplary embodiment, where ray 170 is injected into the cavity 110 by the one or more light sources 120. Ray 170 is reflected by surface 132 of the optical element 130 and becomes redirected ray 172. Redirected ray 172 passes through the output surface 112 and an output element 160. Ray 174, likewise injected into cavity 110 by the one or more light sources 120, is incident upon the aperture 136 of the optical element 130. Ray 174 is channeled through the optical element 130 and directed to the sensor as redirected ray 176. Thus, light injected into the cavity 110 by the one or more light sources 120 can be directed by optical element 130 toward the output surface 112, and it can also be directed through aperture 136 of optical element 130 to the sensor 140. In some embodiments, this may aid in sampling light from the system without significantly degrading output light, which is an advantage of the presently described system.

The cavity 110 may also include an optional output element 160 disposed proximate the output surface 112. The output element 160 may include one or more optical and non-optical elements configured to affect the light that is directed through the output surface 112. For example, in some embodiments, the output element 160 may include a concave or convex lens to refract the light passing through output surface 112.

The output element 160 may include one or more layers that perform one or more desired optical functions, including but not limited to polarization, collimation, or diffusion. For example, the output element 160 may include a diffuser. The diffuser is used to diffuse the light received through the output surface 112. The diffuser may be any suitable diffuser film or plate. The diffuser may include any suitable diffusing material or materials. In some embodiments, the diffuser layer may include a polymeric matrix of polymethyl methacrylate (PMMA) with a variety of disperse phases that include glass, polystyrene beads, and $CaCO_3$ particles. Exemplary diffusers can include 3M™ Scotchcal™ Diffuser Film, types 3635-30, 3635-70, and 3636-100, available from 3M Company, St. Paul, Minn.

The output element 160 may also include a reflective polarizer. Any suitable type of reflective polarizer may be used for the reflective polarizer, e.g., multilayer optical film (MOF) reflective polarizers; diffusely reflective polarizing films (DRPFs), such as continuous/disperse phase polarizers; wire grid reflective polarizers; or cholesteric reflective polarizers.

Both the MOF and continuous/disperse phase reflective polarizers rely on the difference in refractive index between at least two materials, usually polymeric materials, to selectively reflect light of one polarization state while transmitting light in an orthogonal polarization state. Some examples of MOF reflective polarizers are described in co-owned U.S. Pat. No. 5,882,774 (Jonza et al.). Commercially available examples of MOF reflective polarizers include Vikuiti™ DBEF-D200 and DBEF-D440 multilayer reflective polarizers that include diffusive surfaces, available from 3M Company.

Examples of DRPF useful in some embodiments of the present disclosure include continuous/disperse phase reflective polarizers as described, e.g., in co-owned U.S. Pat. No. 5,825,543 (Ouderkirk et al.), and diffusely reflective multilayer polarizers as described, e.g., in co-owned U.S. Pat. No. 5,867,316 (Carlson et al.). Other suitable types of DRPF are described in U.S. Pat. No. 5,751,388 (Larson).

Some examples of wire grid polarizers useful in connection with certain embodiments of the present disclosure include those described, e.g., in U.S. Pat. No. 6,122,103 (Perkins et al.). Wire grid polarizers are commercially available from, among others, Moxtek Inc., (Orem, Utah).

Some examples of cholesteric polarizers useful in connection with various embodiments of the present disclosure include those described, e.g., in U.S. Pat. No. 5,793,456 (Broer et al.), and U.S. Patent Publication No. 2002/0159019 (Pokorny et al.). Cholesteric polarizers are often provided along with a quarter wave retarding layer on the output side so that the light transmitted through the cholesteric polarizer is converted to linearly polarized light.

In some embodiments, the output element 160 may include a polarization control layer provided between a diffuser plate and a reflective polarizer. Examples of polarization control layers include a quarter wave retarding layer and a polarization rotating layer such as a liquid crystal polarization rotating layer. The polarization control layer may be used to change the polarization of light that is reflected from the reflective polarizer so that an increased fraction of the recycled light is transmitted through the reflective polarizer.

The output element 160 may also include one or more brightness enhancing layers. A brightness enhancing layer can redirect off-axis light in a direction close to the axis of the display. This increases the amount of light propagating on-axis, i.e., normal to the output surface 112, thus increasing the brightness to a viewer observing the output surface 112. One example of a brightness enhancing layer is a prismatic brightness enhancing layer, which has a number or prismatic ridges that redirect the illumination light through refraction and reflection. Examples of prismatic brightness enhancing layers that may be used in the present disclosure include the Vikuiti™ BEF II and BEF III family of prismatic films available from 3M Company, including BEF II 90/24, BEF II 90/50, BEF IIIM 90/50, and BEF IIIT.

In one embodiment, the output element 160 may include a first brightness enhancing layer disposed by a reflective polarizer. A prismatic brightness enhancing layer typically provides optical gain in one dimension. If the output element 160 includes a second brightness enhancing layer, oriented orthogonally to the prismatic structure of the first brightness enhancing layer, then such a configuration provides an increase in the optical gain in two dimensions.

The output element 160 and the layers it may include can be free standing. In other embodiments, two or more of the layers of the output element 160 may be laminated together, for example as discussed in co-owned U.S. patent application Ser. No. 10/966,610 (Ko et al.). In other exemplary embodiments, the output element 160 may include two subassemblies separate by a gap, for example, as described in co-owned U.S. patent application Ser. No. 10/965,937 (Gehlsen et al.).

Figure 2:
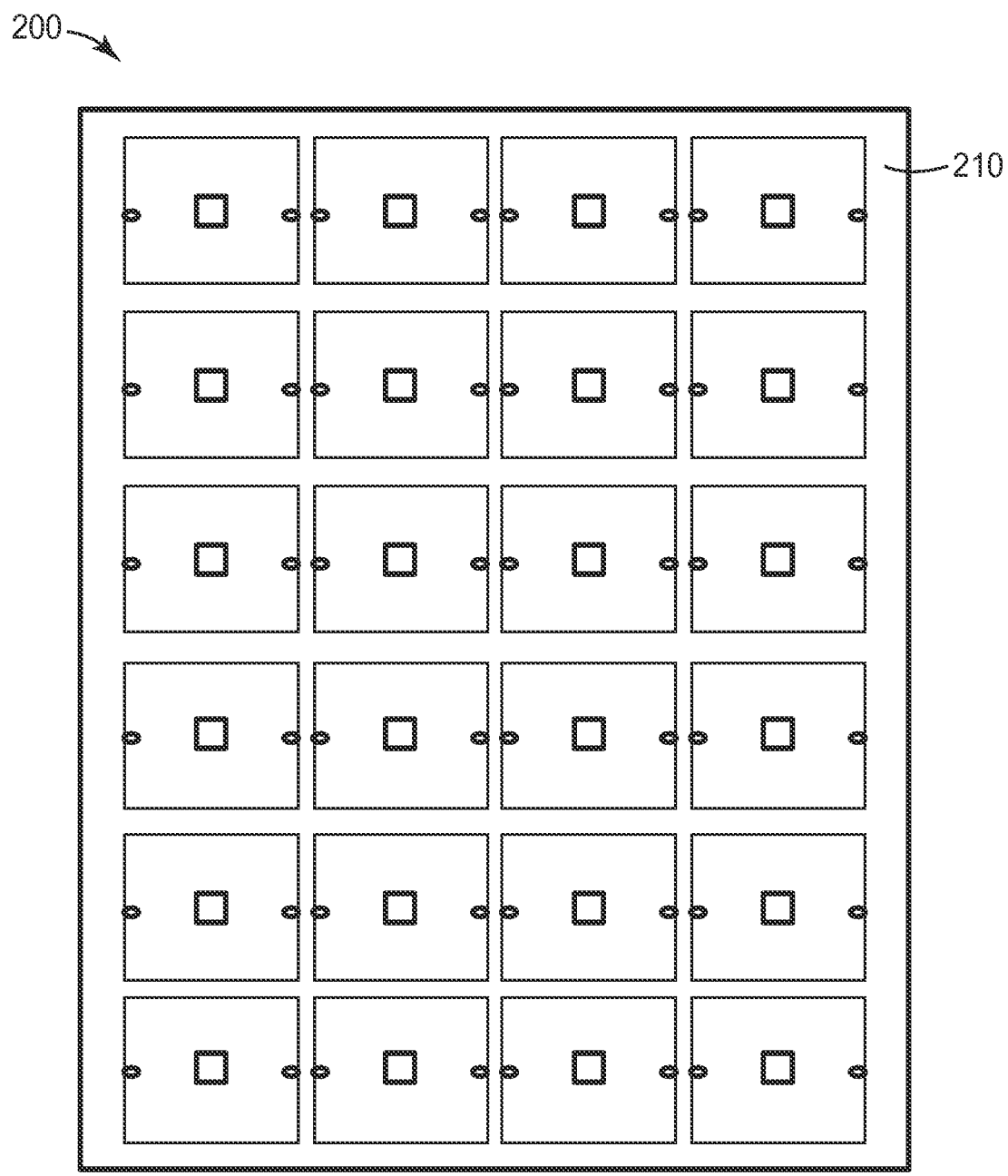
FIG. 2 is a plan view of an array of optical devices according to the present description.

The output element 160 may also be attached to a substrate layer. The substrate layer can be any suitable material or materials, e.g., polycarbonate; acrylic; PET; or fiber reinforced optical film as described, e.g., in U.S. Patent Publication No. 2006/0257678 (Benson et al.), entitled FIBER REINFORCED OPTICAL FILMS; U.S. patent application Ser. No. 11/323,726 (Wright et al.), entitled REINFORCED REFLECTIVE POLARIZER FILMS; and U.S. patent application Ser. No. 11/322,324 (Ouderkirk et al.), entitled REINFORCED REFLECTIVE POLARIZER FILMS. FIG. 2 is a plan view of an array 200 formed substantially from a plurality of optical devices 210. While a rectangular grid is shown in FIG. 2, various shapes and arrangements are contemplated. The optical devices 210 may generally be understood to share the characteristics described with respect to optical device 100 of FIG. 1.

Figure 3:
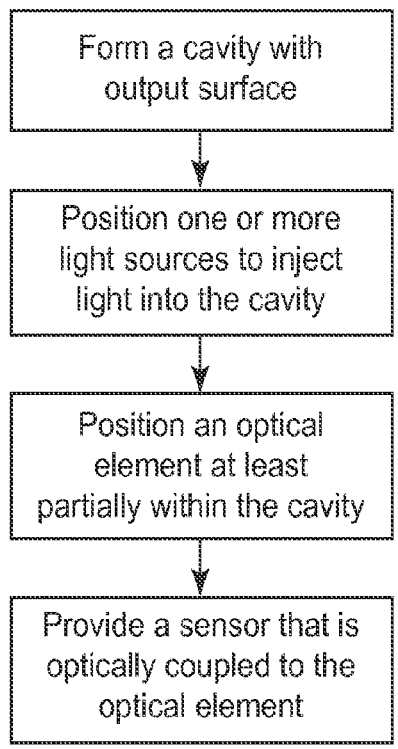
FIG. 3 is a diagram of a method for forming an optical device according to the present description.

FIG. 3 is a diagram of a method of forming an optical device. In one embodiment, the method includes using any suitable process that may be used to form a cavity with an output surface, with any suitable material or configuration as described herein. Next, the method includes positioning one or more light sources to inject light into the cavity. These light sources may be LEDs, CCFLs, or any other light-producing object as described herein, configured in any suitable arrangement or combination, and with any suitable injection optics. The method then includes positioning an optical element is at least partially within the cavity. The optical element can be formed of any suitable material, in any suitable shape, and in any suitable configuration, as described herein. Finally, the method includes providing any suitable sensor that is optically coupled to the optical element.

Figure 4:
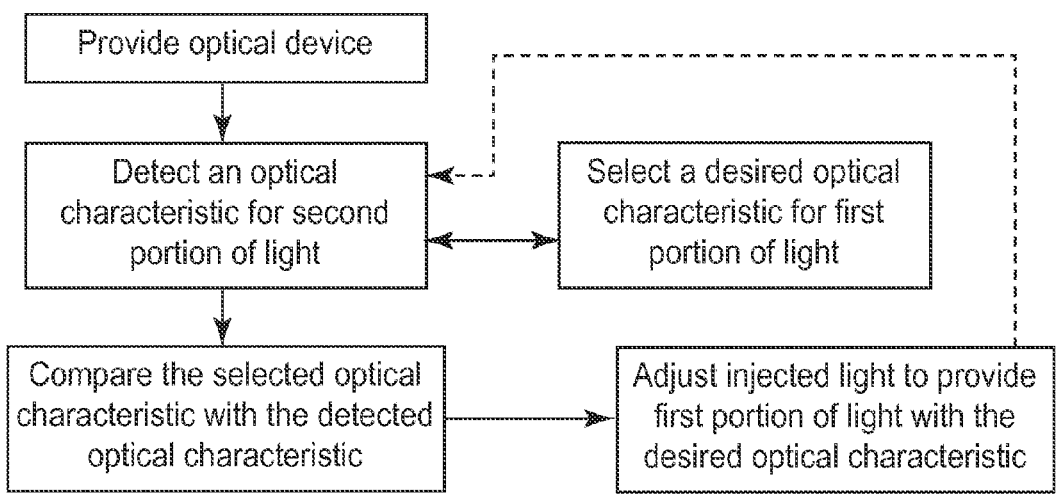
FIG. 4 is a diagram of a method for producing light with a desired optical characteristic according to the present description.

FIG. 4 is a diagram of a method of producing light with a desired optical characteristic. In one embodiment, an optical device is provided that includes a cavity with an output surface, one or more light sources positioned to inject light into the cavity, an optical element disposed at least partially within the cavity, and a sensor optically coupled to the optical element. The optical element may be configured to direct a first portion of light from the one or more light sources to the output surface of the cavity, while directing a second portion of light from the one or more light sources to the sensor. A suitable optical device may share the characteristics described for optical device 100 as shown in FIG. 1. Next, the method includes selecting a desired optical characteristic for the first portion of light. As described herein, the selection may be facilitated by a controller. In some embodiments, the controller may calculate its selection, or it may accept input from a user. In some embodiments, no controller is used. Next, the method includes detecting a second optical characteristic of the second portion of light using the sensor of the optical device. Finally, the method includes adjusting the injected light from the one or more light sources to provide the first portion of light with the desired first optical characteristic. The adjustment may be performed manually or with the aid of the controller. In one embodiment, the steps of detecting and adjusting are repeated, sometimes with many iterations. In each iteration, the selected optical characteristic may be the same or it may be different.

The present invention should not be considered limited to the particular examples and embodiments described above, as such embodiments are described in detail in order to facilitate explanation of various aspects of the invention. Rather, the present invention should be understood to cover all aspects of the invention, including various modifications, equivalent processes, and alternative devices falling within the spirit and scope of the invention as defined by the appended claims.

Exemplary embodiments include the following:

Item 1. An optical device, comprising:
    a cavity comprising an output surface;
    one or more light sources disposed to inject light into the cavity;
    an optical element disposed at least partially within the cavity; and
    a sensor optically coupled to the optical element;
    wherein the optical element is configured to direct a first portion of light from the one or more light sources to the output surface and a second portion of light from the one or more light sources to the sensor.

Item 2. The optical device of item 1, wherein the cavity further comprises a back reflector disposed substantially parallel to the output surface.

Item 3. The optical device of item 1, wherein the cavity further comprises at least two side reflectors disposed substantially orthogonal to the output surface.

Item 4. The optical device of item 1, wherein the cavity comprises a hollow cavity.

Item 5. The optical device of item 1, wherein the one or more light sources comprises at least one LED.

Item 6. The optical device of item 1, wherein the one or more light sources comprises at least one CCFL.

Item 7. The optical device of item 1, wherein the one or more light sources comprises a light source injecting light comprising a first wavelength, a light source injecting light comprising a second wavelength, and a light source injecting light comprising a third wavelength.

Item 8. The optical device of item 7 wherein the first wavelength, the second wavelength, and the third wavelength each comprises at least one of the group comprising red, green, and blue.

Item 9. The optical device of item 7, wherein the first wavelength, the second wavelength, and the third wavelength each comprises at least one of the group comprising blue and yellow.

Item 10. The optical device of item 1, wherein the sensor comprises at least one photodetector.

Item 11. The optical device of item 1, wherein the sensor comprises a remote sensor.

Item 12. The optical device of item 1, wherein the sensor comprises a human eye.

Item 13. The optical device of item 1, wherein the sensor comprises a silicon optical bench.

Item 14. The optical device of item 1, wherein the second portion of light comprises a power substantially within the detection range of the sensor.

Item 15. The optical device of item 1, wherein the second portion of light comprises a power of no more than 10% of a power of the first portion of light.

Item 16. The optical device of item 1, wherein the optical element comprises at least one slit.

Item 17. The optical device of item 1, wherein the second portion of light is directed in a separate direction from the first portion of light because the second portion of light experiences Fresnel Reflection.

Item 18. A method for forming an optical device, comprising:
forming a cavity comprising an output surface;
positioning one or more light sources to inject light into the cavity;
positioning an optical element at least partially within the cavity; and
providing a sensor that is optically coupled to the optical element;
wherein the optical element is configured to direct a first portion of light from the one or more light sources to the output surface and a second portion of light from the one or more light sources to the sensor.

Item 19. A method for producing light with a desired optical characteristic, comprising:
providing an optical device comprising:
a cavity comprising an output surface;
one or more light sources disposed to inject light into the cavity;
an optical element disposed at least partially within the cavity; and
a sensor optically coupled to the optical element;
wherein the optical element is configured to direct a first portion of light from the one or more light sources to the output surface and a second portion of light from the one or more light sources to the sensor;
selecting a desired first optical characteristic of the first portion of light;
detecting a second optical characteristic of the second portion of light using the sensor; and
adjusting the injected light from the one or more light sources to provide the first portion of light with the desired first optical characteristic.

Item 20. The method of item 19, wherein the first and second optical characteristics comprise intensity.

Item 21. The method of item 19, wherein the first and second optical characteristics comprise wavelength.

Item 22. The method of item 19, wherein the first and second optical characteristics comprise phase.

Item 23. An array of optical devices, each optical device comprising:
a cavity comprising an output surface;
one or more light sources disposed to inject light into the cavity;
an optical element at least partially disposed substantially within the cavity; and
a sensor optically coupled to the optical element;
wherein the optical element is configured to direct a first portion of light from the one or more light sources to the output surface and a second portion of light from the one or more light sources to the sensor.

We claim:

1. An optical device, comprising:
a cavity comprising an output surface;
one or more light sources disposed to inject light into the cavity;
an optical element disposed at least partially within the cavity; and
a sensor optically coupled to the optical element;
wherein the optical element is configured to direct a first portion of light from the one or more light sources to the output surface and a second portion of light from the one or more light sources to the sensor, the sensor being configured to detect the second portion of light and generate information based on the detected second portion of light,
wherein the output surface is located at a first side of the optical element, and the sensor is located at a second side of the optical element substantially opposite the first side.

2. The optical device of claim 1, wherein the cavity further comprises a back reflector disposed substantially parallel to the output surface, and at least a portion of the optical element is disposed between the output surface and the back reflector.

3. The optical device of claim 1, wherein the cavity further comprises at least two side reflectors disposed substantially orthogonal to the output surface.

4. The optical device of claim 1, wherein the one or more light sources comprises at least one LED.

5. The optical device of claim 1, wherein the sensor comprises at least one photodetector.

6. The optical device of claim 1, wherein the optical element comprises at least one aperture to guide the second portion of light through the optical element.

7. The optical device of claim 6, wherein the at least one aperture comprises an opening, a slit, or a channel.

8. The optical device of claim 1, wherein the optical element is configured to direct, via selective Fresnel reflection or refraction, the second portion of light in a separate direction from the first portion of light.

9. The optical device of claim 1, wherein the second portion of light comprises a power of no more than 10% of a power of the first portion of light.

10. The optical device of claim 1, further comprising a controller configured to adjust the injected light based on the information from the sensor.

11. A method for producing light with a desired optical characteristic, comprising:
providing an optical device comprising:
a cavity comprising an output surface;
one or more light sources disposed to inject light into the cavity;
an optical element disposed at least partially within the cavity; and
a sensor optically coupled to the optical element;
wherein the optical element is configured to direct a first portion of light from the one or more light sources to the output surface and a second portion of light from the one or more light sources to the sensor, wherein the output surface is located at a first side of the optical element, and the sensor is located at a second side of the optical element substantially opposite the first side;
selecting a desired first optical characteristic of the first portion of light;
detecting a second optical characteristic of the second portion of light using the sensor; and adjusting the injected light from the one or more light sources to provide the first portion of light with the desired first optical characteristic.

12. The method of claim 11, wherein the first and second optical characteristics comprise intensity.

13. The method of claim 11, wherein the cavity further comprises a back reflector disposed substantially parallel to the output surface, and at least a portion of the optical element is disposed between the output surface and the back reflector.

14. The method of claim 11, wherein the cavity further comprises at least two side reflectors disposed substantially orthogonal to the output surface.

15. The method of claim 11, wherein the optical element comprises at least one aperture to guide the second portion of light through the optical element.

16. The method of claim 11, wherein the second portion of light comprises a power of no more than 10% of a power of the first portion of light.

17. The method of claim 11, wherein the injected light is adjusted based on information related to the detected second optical characteristic of the second portion of light.

\* \* \* \* \*